(12) United States Patent
Uchida

(10) Patent No.: US 11,976,167 B2
(45) Date of Patent: May 7, 2024

(54) RESIN COMPOSITION, PREPREG, METAL-CLAD LAMINATE SHEET, AND WIRING BOARD

(71) Applicant: KYOCERA Corporation, Kyoto (JP)

(72) Inventor: Kazumichi Uchida, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/795,520

(22) PCT Filed: Jan. 18, 2021

(86) PCT No.: PCT/JP2021/001492
§ 371 (c)(1),
(2) Date: Jul. 26, 2022

(87) PCT Pub. No.: WO2021/153315
PCT Pub. Date: Aug. 5, 2021

(65) Prior Publication Data
US 2023/0075529 A1 Mar. 9, 2023

(30) Foreign Application Priority Data
Jan. 31, 2020 (JP) .............................. 2020-015290

(51) Int. Cl.
*C08G 65/48* (2006.01)
*C08J 5/24* (2006.01)

(52) U.S. Cl.
CPC ............ *C08G 65/485* (2013.01); *C08J 5/244* (2021.05); *C08J 2371/12* (2013.01)

(58) Field of Classification Search
CPC .................................................. C08G 65/485
See application file for complete search history.

(56) References Cited

U.S. PATENT DOCUMENTS

| | | |
|---|---|---|
| 2011/0263748 A1 | 10/2011 | Schauhoff et al. |
| 2016/0145370 A1 | 5/2016 | Kitai et al. |
| 2020/0389973 A1 | 12/2020 | Uchida |

FOREIGN PATENT DOCUMENTS

| | | |
|---|---|---|
| JP | 2000-226509 A | 8/2000 |
| JP | 2011-225880 A | 11/2011 |
| TW | 201936388 A | 9/2019 |
| WO | 2014/203511 A1 | 12/2014 |
| WO | 2019/198606 A1 | 10/2019 |
| WO | 2019/198607 A1 | 10/2019 |

*Primary Examiner* — Ian A Rummel
(74) *Attorney, Agent, or Firm* — Volpe Koenig

(57) ABSTRACT

A resin composition containing: (A) a modified polyphenylene ether having a main chain modified at a terminal end with a functional group having a carbon-carbon double bond; (B) a crosslinking agent; (C) a crosslinking aid; and (D) an organic peroxide. The crosslinking aid (C) is a compound having a specific structure.

16 Claims, 2 Drawing Sheets

RESIN COMPOSITION, PREPREG, METAL-CLAD LAMINATE SHEET, AND WIRING BOARD

TECHNICAL FIELD

The present disclosure relates to a resin composition, a prepreg in which the resin composition is used, a metal-clad laminate sheet, and a wiring board.

BACKGROUND OF INVENTION

In recent years, there have been an increase in speed and a degree of integration for LSIs, and capacity increase in memory chips. Accordingly, there have been rapid advancement in miniaturization, weight reduction, and thickness reduction for electronic components as well. Therefore, materials used (in theses electronic components) are required to have better heat resistance, dimensional stability, and electrical characteristics.

In the related art, thermosetting resins such as phenol resins, epoxy resins, and polyimide resins have been used in printed wiring boards. Although various performance aspects of these resins are well-balanced, the dielectric characteristics of these resins in the high frequency range are insufficient. Polyphenylene ether is attracting attention as a new printed wiring board material, and there has been an attempt to apply polyethylene ether to a copper-clad laminate sheet (Patent Document 1). On the other hand, in recent years, are increasingly used in various types of environments, and electronic components are now required to maintain performance even when used in harsh environments. Thus, reliability, and particularly reflow resistance, insulation reliability, and connection reliability are strongly required in a printed wiring board that is used in such electronic components.

CITATION LIST

Patent Literature

Patent Document 1: JP 2000-226509 A

SUMMARY OF INVENTION

A resin composition of the present disclosure contains (A) a modified polyphenylene ether having a main chain modified at a terminal end with a functional group having a carbon-carbon double bond (hereinafter, abbreviated as the modified polyphenylene ether (A)), a crosslinking agent (B), a crosslinking aid (C), and an organic peroxide (D), and the crosslinking aid (C) is a compound represented by General Formula (I) or General Formula (II) below.

[Chem. 1]

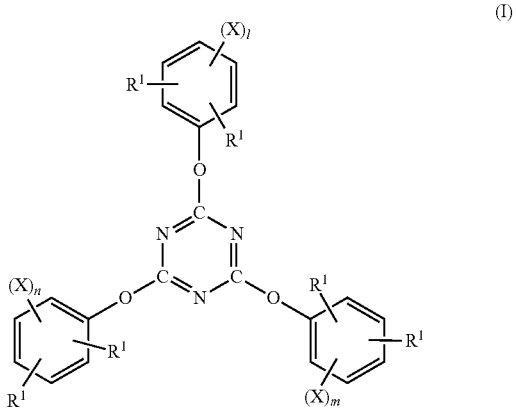

(I)

In General Formula (I), each X is independently a 2-propenyl group or a 2-methyl-2-propenyl group, and each $R^1$ is independently a hydrogen atom, a hydroxy group, a lower alkyl group or a lower alkoxy group. In a case where a plurality of X and a plurality of $R^1$ are present, the plurality of X may be the same or different and the plurality of $R^1$ may be the same or different. Furthermore, l, m, and n are integers of 0 or 1, and at least one of these is 1.

[Chem. 2]

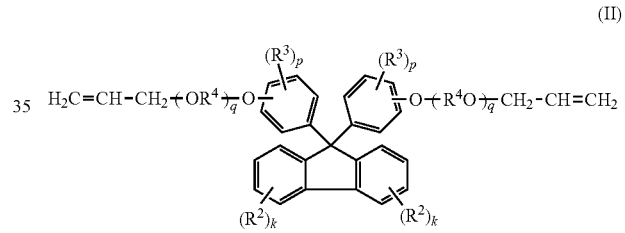

(II)

In General Formula (II), $R^2$ and $R^3$ are each independently a hydrogen atom or a hydrocarbon group, and each $R^4$ is independently an alkylene group. In a case where a plurality of $R^2$ to $R^4$ are present, the plurality of $R^2$ may be the same or different, the plurality of $R^3$ may be the same or different, and the plurality of $R^4$ may be the same or different. Furthermore, k is an integer from 0 to 4, p is an integer from 0 to 4, and q is an integer from 0 to 10.

A prepreg of the present disclosure includes a base member and a semi-cured product of the resin composition of the present disclosure, the base member being coated or impregnated with the resin composition.

A metal-clad laminate sheet of the present disclosure includes a cured product of the prepreg of the present disclosure and a conductive metal foil provided on a surface of the cured product of the prepreg.

A wiring board of the present disclosure includes a plurality of insulation layers and an electrical conductor layer disposed between the insulation layers, and the insulation layers are formed by fully curing the prepreg of the present disclosure.

DESCRIPTION OF EMBODIMENTS

Figure 1:
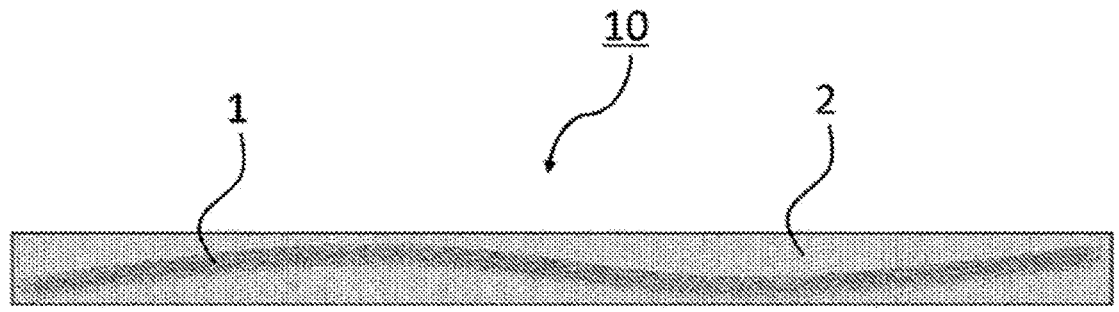
FIG. 1 is a cross-sectional view illustrating an overall configuration of an embodiment of a prepreg of the present disclosure.

For a printed wiring board, further reduction in the dielectric constant and dielectric loss tangent in a higher frequency range is required. The use of the resin composition according to the present disclosure can produce a prepreg and a metal-clad laminate sheet, both having a low dielectric constant and a low dielectric loss tangent, and a wiring board having excellent dielectric properties, reflow resistance, insulation reliability, and connection reliability. Furthermore, the wiring board of the present disclosure may also be configured to exhibit excellent heat resistance and adhesiveness to metal foil.

Hereinafter, the present disclosure will be described in detail with reference to an embodiment. Note that in the present specification, the term "(meth)acrylate group" refers to an acrylate group and/or a methacrylate group.

Resin Composition

The modified polyphenylene ether (A) used in the present embodiment is a polyphenylene ether having a main chain modified at a terminal end with a functional group having a carbon-carbon double bond, and is a component that reacts with the crosslinking agent (B) and the crosslinking aid (C) to form a polymer (crosslinked product). The modified polyphenylene ether (A) can further suppress the dielectric constant and dielectric loss tangent of the cured product to low values.

The modified polyphenylene ether (A) is not particularly limited as long as the modified polyphenylene ether has a main chain modified at a terminal with a functional group having a carbon-carbon double bond.

The functional group having a carbon-carbon double bond is not particularly limited. Examples of the functional group include functional groups represented by General Formula (1) below.

[Chem. 3]

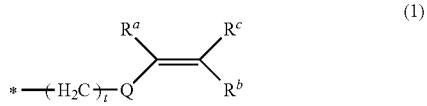

(1)

In General Formula (1), t is an integer from 0 to 10, and may be an integer from 0 to 3. Q is an arylene group, and $R^a$ to $R^c$ are each independently a hydrogen atom or an alkyl group. Also, * indicates a binding moiety. Note that in General Formula (1), if t is 0, Q is bonded directly to the terminal end of the polyphenylene ether.

The arylene group is not particularly limited, and examples thereof include monocyclic aromatic groups such as a phenylene group, and polycyclic aromatic groups in which the aromatic group is not a monocyclic ring but a polycyclic aromatic ring such as a naphthalene ring. Furthermore, the arylene group also includes derivatives in which a hydrogen atom bonded to an aromatic ring is substituted with a functional group such as an alkenyl group, an alkynyl group, a formyl group, an alkyl carbonyl group, an alkenyl carbonyl group, or an alkynyl carbonyl group.

The alkyl group for $R^a$ to $R^c$ is not particularly limited, and may be, for example, an alkyl group having from 1 to 18 carbons, or an alkyl group having from 1 to 10 carbons. The alkyl group may be linear or branched. Specific examples of the alkyl group include a methyl group, an ethyl group, an n-propyl group, an isopropyl group, an n-butyl group, an isobutyl group, a t-butyl group, a pentyl group, a hexyl group, and a decyl group. The alkyl group is preferably a methyl group or an ethyl group.

More specific examples of the functional group include: a vinyl benzyl group (ethenylbenzyl group) such as a p-ethenylbenzyl group and an m-ethenylbenzyl group; a vinyl phenyl group; an acrylate group; and a methacrylate group.

The functional group represented by General Formula (1) may be a functional group including a vinyl benzyl group. Specific examples of the functional group include at least one functional group selected from Formula (a) or Formula (b) below. Note that in Formula (a) and Formula (b) below, the * indicates a binding moiety.

[Chem. 4]

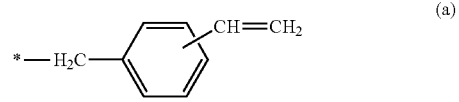

(a)

[Chem. 5]

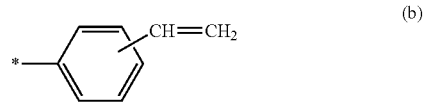

(b)

Examples of other functional groups having a carbon-carbon double bond that are terminal-modifying in the modified polyphenylene ether (A) used in the present embodiment include (meth)acrylate groups, which are, for example, represented by General Formula (2) below.

[Chem. 6]

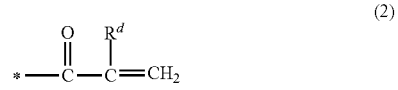

(2)

In General Formula (2), $R^d$ denotes a hydrogen atom or an alkyl group. The alkyl group is not particularly limited, and may be, for example, an alkyl group having from 1 to 18 carbons, an alkyl group having from 1 to 10 carbons, or an alkyl group having from 1 to 8 carbons. The alkyl group may be linear or branched. Specific examples of the alkyl group include a methyl group, an ethyl group, an n-propyl group, an isopropyl group, an n-butyl group, an isobutyl group, a t-butyl group, a pentyl group, a hexyl group, and a decyl group. The alkyl group is preferably a methyl group or an ethyl group. Note that in General Formula (2), * indicates a binding moiety.

The modified polyphenylene ether (A) has a polyphenylene ether chain in the molecule, and may also have, for example, a repeating unit represented by General Formula (3) below in the molecule.

[Chem. 7]

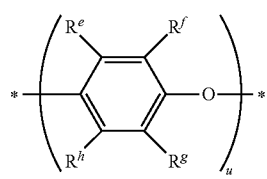

(3)

In General Formula (3), u is an integer from 1 to 100, and may be an integer from 1 to 50, or an integer from 1 to 20. $R^e$ to $R^h$ are each independently a hydrogen atom, an alkyl group, an alkenyl group, an alkynyl group, a formyl group, an alkylcarbonyl group, an alkenyl carbonyl group, an alkynyl carbonyl group or an aryl group. If a plurality of $R^e$ to $R^h$ are present, the plurality of $R^e$ may be the same or different, the plurality of Rf may be the same or different, the plurality of $R^g$ may be the same or different, and the plurality of $R^h$ may be the same or different. Note that, in General Formula (3), * indicates a binding moiety.

The alkyl group for $R^e$ to $R^h$ is not particularly limited, and may be, for example, an alkyl group having from 1 to 18 carbons, an alkyl group having from 1 to 10 carbons, or an alkyl group having from 1 to 8 carbons. The alkyl group may be linear or branched. Specific examples of the alkyl group include a methyl group, an ethyl group, an n-propyl group, an isopropyl group, an n-butyl group, an isobutyl group, a t-butyl group, a pentyl group, a hexyl group, and a decyl group. The alkyl group is preferably a methyl group, an ethyl group, or an isopropyl group.

The alkenyl group for $R^e$ to $R^h$ is not particularly limited, and may be, for example, an alkenyl group having from 2 to 18 carbons, an alkenyl group having from 2 to 10 carbons, or an alkenyl group having from 2 to 8 carbons. The alkenyl group may be linear or branched. Specific examples of the alkenyl group include a vinyl group, an allyl group, and a 3-butenyl group.

The alkynyl group for $R^e$ to $R^h$ is not particularly limited, and may be, for example, an alkynyl group having from 2 to 18 carbons, an alkynyl group having from 2 to 10 carbons, or an alkynyl group having from 2 to 8 carbons. The alkynyl group may be linear or branched. Specific examples of the alkynyl group include an ethynyl group and a prop-2-yn-1-yl group (propargyl group).

The alkyl carbonyl group for $R^e$ to $R^h$ is not particularly limited as long as the alkyl carbonyl group is a carbonyl group substituted with an alkyl group, and may be, for example, an alkyl carbonyl group having from 2 to 18 carbons, or an alkyl carbonyl group having from 2 to 10 carbons. Specific examples of the alkyl carbonyl group include an acetyl group, a propionyl group, a butyryl group, an isobutyryl group, a pivaloyl group, a hexanoyl group, an octanoyl group, and a cyclohexylcarbonyl group.

The alkenyl carbonyl group for $R^e$ to $R^h$ is not particularly limited as long as the alkenyl carbonyl group is a carbonyl group substituted with an alkenyl group, and may be, for example, an alkenyl carbonyl group having from 3 to 18 carbons, or an alkenyl carbonyl group having from 3 to 10 carbons. Specific examples of the alkenyl carbonyl group include an acryloyl group, a methacryloyl group, and a crotonoyl group.

The alkynyl carbonyl group for $R^e$ to $R^h$ is not particularly limited as long as the alkynyl carbonyl group is a carbonyl group substituted with an alkynyl group, and may be, for example, an alkynyl carbonyl group having from 3 to 18 carbons, or an alkynyl carbonyl group having from 3 to 10 carbons. Specific examples of the alkynyl carbonyl group include a propioloyl group.

The aryl group for $R^e$ to $R^h$ is not particularly limited, and may be, for example, an aryl group having from 6 to 10 carbons. Specific examples of the aryl group include a phenyl group.

Also, the alkyl group, the alkenyl group, the alkynyl group, and the aryl group for $R^e$ to $R^h$ may further have a substituent. Examples of the substituent include carboxy groups, aldehyde groups, hydroxy groups, and amino groups.

From the perspective of insulation reliability, the modified polyphenylene ether (A) may be a compound represented by General Formula (III) below.

[Chem. 8]

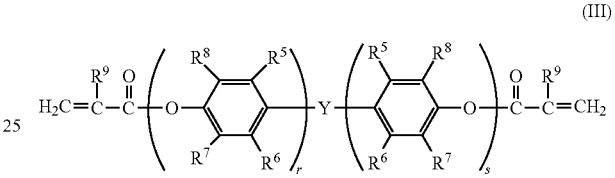

(III)

In General Formula (III), $R^5$ to $R^8$ are each independently a hydrogen atom, a linear or branched alkyl group having from 1 to 8 carbons, a linear or branched alkenyl group having from 2 to 8 carbons, a linear or branched alkynyl group having from 2 to 8 carbons, or an aryl group having from 6 to 10 carbons. Specific examples of the alkyl group, the alkenyl group, the alkynyl group and the aryl group for $R^5$ to $R^8$ include those given as examples for $R^e$ to $R^h$. Moreover, the plurality of $R^5$ may be the same or different, the plurality of $R^6$ may be the same or different, the plurality of $R^7$ may be the same or different, and the plurality of $R^8$ may be the same or different. Of these, from the perspective of insulation reliability, $R^5$ and $R^6$ may be hydrogen atoms, and $R^7$ and $R^8$ may be methyl groups.

Each $R^9$ is independently a hydrogen atom or a linear or branched alkyl group having from 1 to 8 carbons. Specific examples of the alkyl group for $R^9$ include those given as examples with regard to $R^d$. Moreover, the plurality of $R^9$ may be the same or different. Of these, from the perspective of insulation reliability, $R^9$ may be a methyl group.

Y is an oxygen atom, a methylene group or a dimethyl methylene group. Among these, from the perspective of insulation reliability, Y may be a dimethyl methylene group.

Furthermore, r is an integer from 1 to 100, and may be an integer from 1 to 50 or an integer from 1 to 20. In addition, s is an integer from 1 to 100, and may be an integer from 1 to 50 or from 1 to 20. Also, r+s is an integer from 2 to 200, and may be an integer from 2 to 100 or from 2 to 40.

A number average molecular weight (Mn) of the modified polyphenylene ether (A) is not particularly limited. Specifically, the number average molecular weight may be from 500 to 8000, from 800 to 6000, or from 1000 to 4000.

Note that the number average molecular weight is measured by a method employed in measuring molecular weight in general, and as a specific example, the number average molecular weight is measured using gel permeation chromatography (GPC).

A commercially available modified polyphenylene ether product may be used as the modified polyphenylene ether (A). Examples of the commercially available products include SA9000 (trade name, available from Saudi Basic Industries Corporation (SABIC), number average molecular weight (Mn) from 2000 to 3000) and OPE-2St (trade name, available from Mitsubishi Gas Chemical Co., Inc., number average molecular weight (Mn) from 2000 to 6000).

A content of the modified polyphenylene ether (A) may be from 40 mass % to 95 mass %, or from 50 mass % to 75 mass % when the total amount of the modified polyphenylene ether (A), the crosslinking agent (B), the crosslinking aid (C), and the organic peroxide (D) is considered to be 100 mass %. The dielectric constant and the dielectric loss tangent of the cured product can be reduced, and the heat resistance can be enhanced by setting the content of the modified polyphenylene ether (A) to the range described above.

The crosslinking agent (B) used in the present embodiment is a component that reacts with the modified polyphenylene ether (A) and the crosslinking aid (C) to form a polymer (crosslinked product). Here, in the present specification, the crosslinking agent (B) is an agent with which a polymer (crosslinked product) having high heat resistance can be produced when the modified polyphenylene ether (A), the crosslinking agent (B) and an organic peroxide (D) are mixed and polymerized (crosslinked) through heating. The crosslinking aid (C) serves to promote a crosslinking reaction between the modified polyphenylene ether (A) and the crosslinking agent (B). When the modified polyphenylene ether (A), the crosslinking aid (C), and the organic peroxide (D) are mixed and heated without the crosslinking agent (B) included, polymerization (crosslinking) does not proceed, and fails to produce a polymer (crosslinked product) with high heat resistance. The crosslinking agent (B) is not particularly limited as long as the crosslinking agent has a carbon-carbon double bond within the molecule. A cured product having excellent dielectric properties and heat resistance can be obtained by using the crosslinking agent (B). In addition, polymerization of the carbon-carbon double bond in the molecule of the crosslinking agent (B) and the carbon-carbon double bond of the modified polyphenylene ether (A) improves the heat resistance of the cured product, and enables high insulation reliability and high connection reliability.

Examples of the crosslinking agent (B) described above include compounds having two or more carbon-carbon double bonds per molecule, alkenyl isocyanurate compounds, styrene, styrene derivatives, allyl compounds having at least one allyl group per molecule, maleimide compounds having at least one maleimide group per molecule, modified maleimide compounds, and acenaphthylene compounds having an acenaphthylene structure in the molecule. Also, examples of the compound having two or more carbon-carbon double bonds per molecule include polyfunctional methacrylate compounds having two or more methacryloyl groups per molecule, polyfunctional acrylate compounds having two or more acryloyl groups per molecule, and polyfunctional vinyl compounds having two or more vinyl groups per molecule. Examples of the polyfunctional methacrylate compound include tricyclodecane dimethanol dimethacrylate. Examples of the polyfunctional acrylate compound include tricyclodecane dimethanol diacrylate. Examples of the polyfunctional vinyl compound include divinyl benzene, dibutyl benzene, and polybutadiene. The alkenyl isocyanurate compound need only be a compound having an isocyanurate structure and an alkenyl group in the molecule, and examples thereof include trialkenyl isocyanurate compounds such as triallyl isocyanurate (TAIC). Examples of the styrene derivatives include bromostyrene. Examples of the allyl compounds include triallyl cyanurate (TAC). Examples of the modified maleimide compound include modified maleimide compounds in which a part of the molecule is amine-modified, modified maleimide compounds in which a part of the molecule is silicone-modified, and modified maleimide compounds in which a part of the molecule is amine-modified and silicone-modified. It is conceivable that when these compounds are used as the crosslinking agent (B), crosslinks are formed through a crosslinking reaction, which can further improve the heat resistance of the cured product of the resin composition of the present embodiment. As the crosslinking agent (B), a single type of crosslinking agent given as an example above may be used alone, or two or more types may be used in combination.

Furthermore, as the crosslinking agent (B), a compound having two or more carbon-carbon double bonds per molecule and a compound having one carbon-carbon double bond per molecule may be used in combination. Specific examples of the compound having one carbon-carbon double bond per molecule include compounds (monovinyl compounds) having one vinyl group per molecule.

From the perspective of heat resistance, the crosslinking agent (B) may be at least one compound selected from dibutyl benzene, tricyclodecane dimethanol diacrylate, tricyclodecane dimethanol dimethacrylate, triallyl cyanurate and triallyl isocyanurate, and is preferably triallyl isocyanurate.

A commercially available product can be used as the crosslinking agent (B). Examples of the triallyl isocyanurate include TAICROS (trade name, available from Evonik Industries AG). Examples of the triallyl cyanurate include TAC (trade name, available from Evonik Industries AG). Examples of the divinyl benzene include DVB-960 (trade name, available from Nippon Steel Chemical & Material Co., Ltd.). Examples of the tricyclodecane dimethanol diacrylate include A-DCP (trade name, available from Shin-Nakamura Chemical Co., Ltd.). Examples of the tricyclodecane dimethanol dimethacrylate include DCP (trade name, available from Shin-Nakamura Chemical Co., Ltd.).

A content of the crosslinking agent (B) may be from 5 mass % to 60 mass % or from 10 mass % to 40 mass % when the total amount of the modified polyphenylene ether (A), the crosslinking agent (B), the crosslinking aid (C), and the organic peroxide (D) is considered to be 100 mass %. The dielectric constant and the dielectric loss tangent of the cured product can be reduced by setting the content of the crosslinking agent (B) to the range described above.

The crosslinking aid (C) used in the present embodiment is a compound represented by General Formula (I) or General Formula (II) below, and is a component that reacts with the modified polyphenylene ether (A) and the crosslinking agent (B) to form a polymer (crosslinked product). The double bond present in General Formula (I) or General Formula (II) and the double bonds present in the modified polyphenylene ether (A) and the crosslinking agent (B) react and polymerize to form a cured product.

[Chem. 9]

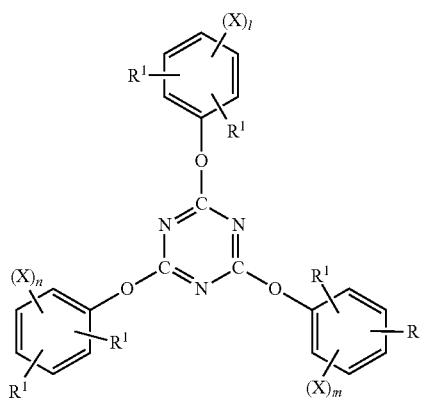

In General Formula (I), each X is independently a 2-propenyl group or a 2-methyl-2-propenyl group. X is preferably a 2-propenyl group. Each $R^1$ is independently a hydrogen atom, a hydroxy group, a lower alkyl group or a lower alkoxy group. $R^1$ is preferably a hydrogen atom. The lower alkyl group for $R^1$ may be a linear or branched alkyl group having from 1 to 6 carbons. Specific examples of the lower alkyl group include a methyl group, an ethyl group, an n-propyl group, an isopropyl group, an n-butyl group, an isobutyl group, a t-butyl group, a pentyl group, and a hexyl group. The lower alkoxy group of $R^1$ may be an alkoxy group having from 1 to 6 carbons. Specific examples of the lower alkoxy group include a methoxy group, an ethoxy group, a propoxy group, an isopropoxy group, a butoxy group, and an isobutoxy group. In a case in which a plurality of X and $R^1$ are present, the plurality of X may be the same or different and the plurality of $R^1$ may be the same or different.

Furthermore, l, m, and n are integers of 0 or 1, and at least one of these is 1.

[Chem. 10]

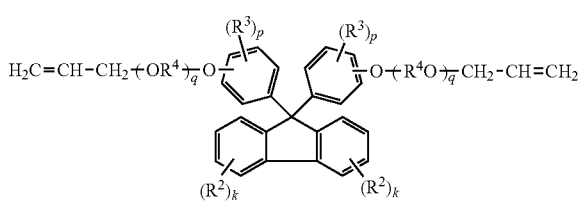

In General Formula (II), $R^2$ and $R^3$ are each independently a hydrogen atom or a hydrocarbon group. The hydrocarbon group may be an alkyl group having from 1 to 10 carbons, or an alkyl group having from 1 to 6 carbons. The hydrocarbon group may be linear or branched. Specific examples of the hydrocarbon group include a methyl group, an ethyl group, an n-propyl group, an isopropyl group, an n-butyl group, an isobutyl group, a t-butyl group, a pentyl group, a hexyl group, a heptyl group, and an octyl group. The hydrocarbon group is preferably a methyl group or an ethyl group. Each $R^4$ is independently an alkylene group. The alkylene group may be an alkylene group having from 1 to 10 carbons, or an alkylene group having from 1 to 6 carbons. The alkylene group may be linear or branched. Specific examples of the alkylene group include a methylene group, an ethylene group, an n-propylene group, an isopropylene group, a butylene group, a hexylene group, and an octylene group. The alkylene group is preferably a methylene group or an ethylene group. In a case where a plurality of $R^2$ to $R^4$ are present, the plurality of $R^2$ may be the same or different, the plurality of $R^3$ may be the same or different, and the plurality of $R^4$ may be the same or different.

In addition, k is an integer from 0 to 4, may be an integer from 0 to 2, or may be 0. Furthermore, p is an integer from 0 to 4, may be an integer from 0 to 2, or may be 1. Moreover, q is an integer from 0 to 10, may be an integer from 0 to 4, may be an integer from 0 to 2, or may be 0.

From the perspective of the heat resistance of the cured product, the crosslinking aid (C) is preferably a compound represented by General Formula (I), and from the perspective of insulation reliability, the crosslinking aid (C) is preferably a compound represented by General Formula (II).

From the perspective of heat resistance, the molecular weight of the crosslinking aid (C) is preferably 400 or greater. The upper limit may be 1000.

A commercially available product can be used as the crosslinking aid (C). Examples of commercially available products of the compound represented by General Formula (I) include TAC HT-P (trade name, available from Evonik Industries AG). Examples of commercially available products of the compound represented by General Formula (II) include OGSOL AL-001 (trade name, available from Osaka Gas Co., Ltd.).

The content of the crosslinking aid (C) may be from 1 mass % to 35 mass %, or from 3 mass % to 20 mass % when the total amount of the modified polyphenylene ether (A), the crosslinking agent (B), the crosslinking aid (C), and the organic peroxide (D) is considered to be 100 mass %. When the content of the crosslinking aid is in the range described above, the heat resistance of the cured product can be enhanced, and the dielectric constant and the dielectric loss tangent of the cured product can be reduced.

Note that at least one type of thermoplastic resin and thermosetting resin other than the modified polyphenylene ether (A), the crosslinking agent (B) and the crosslinking aid (C) may be added to the resin composition according to the present embodiment. Examples of the thermoplastic resin include general-purpose polystyrene (GPPS) and high impact polystyrene (HIPS). Examples of the thermosetting resin include epoxy resins. These resins may be used alone or in combinations of two or more.

The organic peroxide (D) used in the present embodiment is not particularly limited as long as it is a compound that acts as a radical initiator. The organic peroxide (D) is a compound that generates a radical in mild conditions and promotes a polymerization reaction in order to cause the modified polyphenylene ether (A), the crosslinking agent (B) and the crosslinking aid (C) to polymerize through a radical reaction and produce a polymer (crosslinked product) of these.

Examples of the organic peroxide (D) include organic peroxides that function as known radical initiators. From the perspective of further reducing the dielectric constant of the cured product, the organic peroxide (D) may have a molecular weight from 30 to 400, from 30 to 300, or from 30 to 200.

Examples of commercially available products of the organic peroxide (D) include Perbutyl D (trade name, available from NOF Corporation, di-t-butyl peroxide, molecular weight: 146), Perbutyl Z (trade name, available from NOF Corporation, t-butyl peroxy benzoate, molecular weight:

194), Perhexyne 25B (trade name, available from NOF Corporation, 2,5-dimethyl-2,5-di(t-butyl peroxide)hexyne-3, molecular weight: 286), and Perbutyl P (trade name, available from NOF Corporation, α,α'-di-(t-butylperoxy) diisopropylbenzene, molecular weight: 338). Note that the organic peroxide (D) may have a structure without a benzene ring. Absence of a benzene ring in the organic peroxide (D) can efficiently reduce the dielectric loss tangent of the cured product. From the perspective of heat resistance, the organic peroxide (D) is preferably Perbutyl D.

The content of the organic peroxide (D) may be from 0.01 mass % to 15 mass % or from 0.5 mass % to 10 mass % when the total amount of the modified polyphenylene ether (A), the crosslinking agent (B), the crosslinking aid (C), and the organic peroxide (D) is considered to be 100 mass %. When the content of the organic peroxide is in the range described above, the adhesiveness of the resin composition to a metal foil can be improved in a case where the resin composition is used to form a metal-clad laminate sheet or the like.

The resin composition according to the present embodiment may further contain an organic solvent (E). The organic solvent (E) is used as a solvent for dissolving or dispersing the resin components, namely, the modified polyphenylene ether (A), the crosslinking agent (B), the crosslinking aid (C) and the organic peroxide (D). Examples of the organic solvent (E) include aromatic solvents such as toluene, benzene, and xylene, ketone-based solvents such as acetone and methyl ethyl ketone, and solvents such as tetrahydrofuran and chloroform. From the perspectives of solubility and storage stability, the organic solvent (E) preferably includes toluene and/or methyl ethyl ketone. Furthermore, from the perspective of the drying property of a prepreg, the organic solvent (E) is preferably methyl ethyl ketone.

From the perspective of coatability and outer appearance of the prepreg, when the organic solvent (E) is used, the content of the organic solvent (E) when externally added may be from 25 mass % to 100 mass % or from 35 mass % to 65 mass %, when the total amount of the modified polyphenylene ether (A), the crosslinking agent (B), the crosslinking aid (C), and organic peroxide (D) is considered to be 100 mass %.

The resin composition according to the present embodiment may include, as necessary, silica, a flame retardant, a stress relieving agent, and the like within a range that does not inhibit the effects of the present disclosure. The silica needs to be a silica that can be blended in this type of composition, and examples thereof include crushed silica and fused silica. A single type of these silicas may be used, or two or more types thereof may be mixed and used. More specific examples of the silica include fused silica that has been surface treated with methacrylic silane, and for example, SFP-30MHM (trade name, available from Denka Co., Ltd.), SFP-130MC (trade name, available from Denka Co., Ltd.), and FUSELEX E-2, Adma Fine SO-C5, and PLV-3 (trade names, all available from Tatsumori Ltd.) can be used.

As the silica, silica particles having an average particle size of 10 μm or less may be used, and silica particles having an average particle size from 0.1 μm to 10 μm may be used. When the resin composition is used to form, for example, a metal-clad laminate sheet, the adhesiveness of the resin composition to the metal foil can be further improved by using silica particles having such a size. The average particle size of the silica is the particle size at which the cumulative volume in a particle size distribution reaches 50% (50% particle size D50). The particle size distribution is measured by, for example, a laser diffraction-type particle size distribution measurement device.

When silica is used, the silica content may be from 5 parts by mass to 40 parts by mass, or from 10 parts by mass to 40 parts by mass, when the total amount of the modified polyphenylene ether (A), the crosslinking agent (B), the crosslinking aid (C), and the organic peroxide (D) is considered to be 100 parts by mass. When the content of the silica is within the range described above, the melt fluidity of the resin composition is further improved. Furthermore, when the resin composition is used in, for example, a metal-clad laminate sheet, the adhesiveness to the metal foil can be further improved, and through-hole connection reliability can also be further enhanced.

The flame retardant is not particularly limited as long as it is blended into this type of resin composition, and examples thereof include melamine polyphosphate, melam polyphosphate, melem polyphosphate, melamine pyrophosphate, ammonium polyphosphate, red phosphorus, aromatic phosphates, phosphonates, phosphinates, phosphine oxides, phosphazenes, and melamine cyanorate. These flame retardants may be used alone or in a combination of two or more. From the perspective of dielectric characteristics and properties such as flame resistance, thermal resistance, adhesiveness, moisture resistance, chemical resistance, and reliability, melamine pyrophosphate, melamine polyphosphate, melam polyphosphate, and ammonium polyphosphate are preferably used.

When a flame retardant is used, the content of the flame retardant may be from 15 parts by mass to 45 parts by mass when the total amount of the modified polyphenylene ether (A), the crosslinking agent (B), the crosslinking aid (C), and the organic peroxide (D) is considered to be 100 parts by mass. When the content of the flame retardant is in the range described above, flame resistance and thermal resistance can be further improved with almost no impact on the dielectric characteristics, adhesiveness, and moisture resistance.

The stress relieving agent is not particularly limited as long as it is a type that is blended into this type of resin composition, and examples thereof include silicone resin particles having a core-shell structure and silicone resin particles other than those having a core-shell structure. Examples of the silicone resin particles include a silicone rubber-silicon resin composite powder (trade name: X-52-7030, available from Shin-Etsu Chemical Co., Ltd.), MSP-1500 (trade name, available from Nikko Rica Corporation), and MSP-3000 (trade name, available from Nikko Rica Corporation). A single type of these stress relieving agents may be used, or two or more may be used in combination.

The silicone resin particles having a core-shell structure (hereinafter, also referred to simply as a core-shell structural body) have a silicone-based polymer in the core portion and/or the shell portion, and are a component that is used to impart elasticity to the cured product of the resin composition. In the core-shell structural body, the core portion is a silicone-based polymer having elasticity as with silicone rubber, and the shell portion is a silicone-based polymer having solvent resistance as with silicon resin, and thereby the silicone resin particles are sufficiently dispersed, and elasticity can be imparted to the cured product of the resin composition. When a silicone-based polymer is used in the core portion, solvent resistance is excellent. When a silicone-based polymer is used in the shell portion, thermal resistance is excellent.

As the stress relieving agent, one having an average particle size of 10 μm or less may be used. When the resin composition is used to form, for example, a metal-clad laminate sheet, the adhesiveness of the resin composition to the metal foil can be further improved by using a stress relieving agent having such an average particle size. When the stress relieving agent is used, the content thereof may be from 1 parts by mass to 10 parts by mass when the total amount of the modified polyphenylene ether (A), the crosslinking agent (B), the crosslinking aid (C), and the organic peroxide (D) is considered to be 100 parts by mass. Furthermore, in a case where the resin composition is used, for example, in a metal-clad laminate sheet, when the content of the stress relieving agent is in this range, moisture resistance and the adhesiveness of the resin composition to the metal foil as well as through-hole connection reliability can be further improved.

In addition to the components described above, other components such as an additive and a filler other than silica may be added, as appropriate, to the resin composition according to the present embodiment. Examples of the fillers other than silica include titanium oxide, barium titanate, glass beads, and glass hollow spheres. Examples of additives include carbon black, antioxidants, thermal stabilizers, antistatic agents, plasticizers, pigments, dyes, and colorants. Specific examples of additives include R-42 (available from Sakai Chemical Industry Co., Ltd.) and IRGANOX 1010 (available from BASF). A single type of these fillers and additives may be used alone, or two or more may be combined and used.

The resin composition according to the present embodiment is obtained, for example, by mixing the components of (A) to (D) described above and other components as necessary. The mixing method is not particularly limited, and the components may be mixed by a known method. Examples of the mixing method include a solution-mixing method in which all of the components are uniformly dissolved or dispersed in a solvent, and a melt-blending method in which all of the components are heated and mixed by an extruder or the like.

In a case where silica is contained, the content of the components (A) to (D) in the solid content of the resin composition according to the present embodiment may be from 35 mass % to 70 mass % or from 50 mass % to 60 mass %, and in a case where silica is not contained, the content of the components (A) to (D) in the solid content of the resin composition may be from 60 mass % to 95 mass %, or from 75 mass % to 85 mass %.

Prepreg

FIG. 1 is a cross-sectional view illustrating an overall configuration of an embodiment of a prepreg of the present disclosure. The prepreg 10 according to the present embodiment is configured with a base member 1 and a semi-cured product 2 of the resin composition according to the present embodiment, the resin composition being coated onto or impregnated into the base member 1. For example, the prepreg can be obtained by coating or impregnating the base member with the resin composition described above according to a conventional method, and then drying and semi-curing the coated or impregnated base member. Examples of the base member include paper, and woven fabrics and nonwoven fabrics of fibers such as glass and polyimide. Examples of the material of the glass include ordinary E glass, as well as D glass, S glass, and quartz glass.

The proportion of the base member in the prepreg may be from 20 mass % to 80 mass % of the entire prepreg. In a case where the proportion of the base member is within this range, dimensional stability and strength after curing of the prepreg are more likely to be exhibited. In addition, better dielectric characteristics are also obtained. A coupling agent such as a silane coupling agent or a titanate-based coupling agent can be used, as necessary, in this prepreg.

The method of manufacturing the prepreg according to the present embodiment is not particularly limited, and examples include a method of uniformly dissolving or dispersing the resin composition according to the present embodiment in a solvent as necessary, coating or impregnating the base member, and then drying the coated or impregnated base member. Furthermore, the resin composition may be melted and then impregnated into the base member.

Examples of the solvent include aromatic solvents such as toluene, and ketone-based solvents such as methyl ethyl ketone.

The coating method and the impregnation method are not particularly limited, and examples thereof include a method of applying a solution or dispersion of the resin composition using a spray, a brush, a bar coater, or the like, and a method (dipping) of immersing the base member in a solution or dispersion of the resin composition. The coating or impregnation can be repeated multiple times if necessary. Alternatively, the coating or impregnation can be repeated using a plurality of solutions or dispersions of different resin concentrations.

The prepreg is subjected to heating and molding, for example, and processed into a laminate sheet. The laminate sheet is obtained, for example, by stacking a plurality of prepregs according to the desired thickness, and then subjecting to heating and compression molding. Furthermore, a thicker laminate sheet can be obtained by combining the obtained laminate sheet and another prepreg. The lamination molding and curing are ordinarily implemented simultaneously using a hot press, but may be implemented separately. That is, first, the prepreg may be laminated and molded to obtain a semi-cured laminate sheet, and then the semi-cured laminate sheet may be fully cured by treating with a heat treatment device. Heating and compression molding may be implemented at a temperature from 80° C. to 300° C. under pressurization from 0.1 MPa to 50 MPa for a time from 1 minute to 10 hours, or at a temperature from 150° C. to 250° C. under pressurization from 0.5 MPa to 10 MPa for a time from 10 minutes to 5 hours.

Furthermore, when the resin composition containing the organic solvent (E) is used as the resin composition of the present embodiment, the content of the organic solvent (E) in the prepreg may be 0.5 mass % or less (but excluding, of course, 0 mass %). In other words, when the organic solvent (E) remains in the prepreg at an amount exceeding 0 mass %, the fluidity of the resulting prepreg is improved, and the adhesiveness of the prepreg to the metal foil after curing is also improved. On the other hand, when the residual amount of the organic solvent (E) in the prepreg is 0.5 mass % or less, a decrease in the glass transition temperature of the prepreg after curing is reduced, and heat resistance can be maintained. The residual amount of the organic solvent (E) in the prepreg may be from 0.1 mass % to 0.3 mass %. The residual amount of the organic solvent (E) may be measured using, for example, a gas chromatograph, but the measurement method is not limited thereto.

The content of the organic solvent (E) in the prepreg is determined by the following method. For example, when toluene is used as the organic solvent, the prepreg is dissolved in ethylbenzene, and the resulting solution is introduced into a gas chromatograph. The amount of toluene in the solution is measured, and the mass of toluene in the entire prepreg is calculated.

Metal-Clad Laminate Sheet

Figure 2:
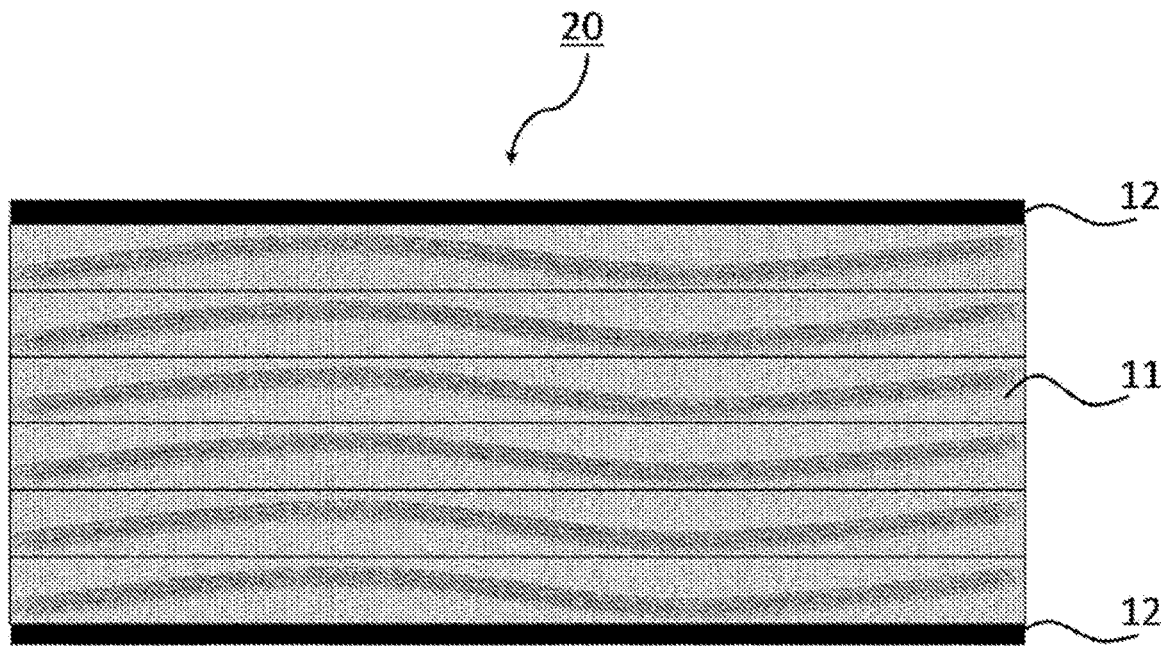
FIG. 2 is a cross-sectional view illustrating an overall configuration of an embodiment of a metal-clad laminate sheet of the present disclosure.

FIG. 2 is a cross-sectional view illustrating an overall configuration of an embodiment of a metal-clad laminate sheet of the present disclosure. A metal-clad laminate sheet 20 according to the present embodiment is configured to include a conductive metal foil 12 on a surface of an insulation layer 11 containing a cured product of the prepreg 10 according to the present embodiment. The conductive metal foil 12 may be provided on one side of the insulation layer 11, or may be provided on both sides. Additionally, as illustrated in FIG. 2, the insulation layer 11 may be a laminate sheet of a plurality of superimposed layers. The metal-clad laminate sheet can be obtained by superimposing the prepreg and the conductive metal foil, and then heating and compression molding the superimposed prepreg and conductive metal foil.

Here, the conductive metal foil is not particularly limited as long as it is a conductive metal foil that is used in a known metal-clad laminate sheet. Examples of the conductive metal foil include copper foil such as electrolytic copper foil and rolled copper foil, aluminum foil, and composite foils obtained by superimposing these metal foils. The conductive metal foil is preferably a copper foil.

The thickness of the conductive metal foil is not particularly limited, and may be from 5 μm to 105 μm. The metal-clad laminate sheet according to the present embodiment can also be obtained by superimposing a desired number of layers of each of the prepreg according to the present embodiment and the conductive metal foil, and then heating and compression molding. The metal-clad laminate sheet is used, for example, in the manufacturing of a printed circuit board.

Wiring Board

Figure 3:
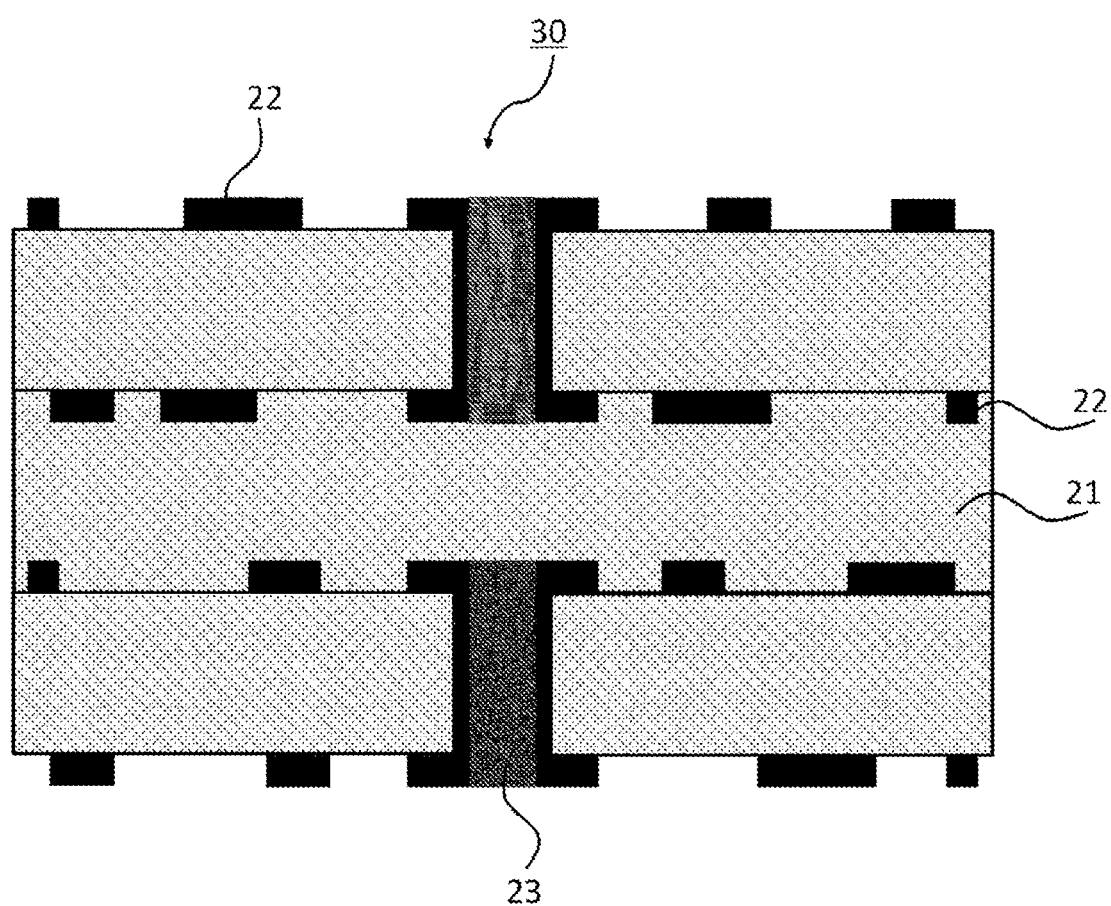
FIG. 3 is a cross-sectional view illustrating an overall configuration of an embodiment of a wiring board of the present disclosure.

FIG. 3 is a cross-sectional view illustrating an overall configuration of an embodiment of a wiring board of the present disclosure. A wiring board 30 according to the present embodiment includes a plurality of insulation layers 21 and an electrical conductor layer 22 disposed between the insulation layers. Each insulation layer 21 is formed of a base member and a cured product of a resin composition according to the present embodiment, that is, a cured product of the prepreg according to the present embodiment. The electrical conductor layer 22 can be formed, for example, by etching the conductive metal foil of the metal-clad laminate sheet according to the present embodiment in a predetermined wiring pattern.

The wiring board 30 according to the present embodiment is obtained, for example, by superimposing, on a metal-clad laminate sheet according to the present embodiment, a prepreg and an inner layer sheet in which through-holes 23 and a circuit (electrical conductor layer) 22 are formed, and laminating the conductive metal foil to the surface of the prepreg, and then subjecting the laminate to heating and compression molding. Furthermore, the circuit (electrical conductor layer) 22 and the through-holes 23 may be formed in the conductive metal foil of the surface to form a multilayer printed wiring board.

EXAMPLES

Next, the present disclosure will be specifically described through examples; however, the present disclosure is not limited in any way to these examples.

Examples 1 to 12, Comparative Examples 1 to 6

A modified polyphenylene ether (A), a crosslinking agent (B), a crosslinking aid (C), organic peroxide (D), and silica were mixed at the proportions shown in Table 1 and Table 2. The components were stirred at room temperature (25° C.), and resin compositions were obtained. Furthermore, each resin composition was dissolved in an organic solvent (E) to obtain a resin composition (resin varnish) containing the organic solvent (E).

A glass woven fabric (available from Asahi Kasei Corporation, trade name: A3313/AS760MSW) having a thickness of 100 μm was immersed in the obtained resin varnish to impregnate the glass woven fabric with the resin varnish. Subsequently, the impregnated glass woven fabric was dried at 130° C. for 7 minutes, and a prepreg having a thickness of 130 μm was obtained.

Next, a laminate was prepared by superimposing eight of the obtained prepregs. A copper foil having a thickness of 18 μm was then laminated onto both sides of the obtained laminate. The resin in the prepreg was then cured by heating at 190° C. for 90 minutes under pressurization of 3 MPa, and a copper-clad laminate sheet having a thickness of 0.9 mm was obtained.

Details of each component used in the examples and comparative examples and described in Table 1 and Table 2 are as follows.

Modified Polyphenylene Ether (A)

(A1) Methacryl-modified polyphenylene ether SA 9000 (trade name, available from SABIC, number average molecular weight (Mn): from 2000 to 3000)

(A2) Vinyl styrene-modified polyphenylene ether OPE-2St (trade name, available from Mitsubishi Gas Chemical Co., Inc., number average molecular weight (Mn): from 2000 to 6000)

Modified Polyphenylene Ether Other Than Component (A)

(a1) Maleic anhydride-modified polyphenylene ether APPE-LM (trade name, available from Asahi Kasei Corporation, number average molecular weight (Mn): from 20000 to 40000)

Crosslinking Agent (B)

(B1) Triallyl isocyanurate (available from Evonik Industries AG, trade name: TAICROS, molecular weight: 300)

(B2) Triallyl cyanurate (available from Evonik Industries AG, trade name: TAC, molecular weight: 249)

(B3) Tricyclodecane dimethanol diacrylate (available from Shin-Nakamura Chemical Co., Ltd., trade name: A-DCP, molecular weight: 304)

Crosslinking Aid (C)

(C1) Triazine-skeleton compound TAC HT-P (trade name, available from Evonik Industries AG, in General Formula (I), $R^1$=hydrogen atom, X=2-propenyl group, l=1, m=1, and n=1, molecular weight: 477)

(C2) Fluorene compound OGSOL AL-001 (trade name, available from Osaka Gas Co., Ltd., in General Formula (II), $R^3$=methyl group, k=0, p=1, and q=0, molecular weight: 458)

Crosslinking Aid Other Than the Component (C)

(c1) Tris (2-acryloyloxyethyl)isocyanurate FA-731A (trade name, available from Hitachi Chemical Co., Ltd., compound represented by formula (IV) below, molecular weight: 423)

[Chem. 11]

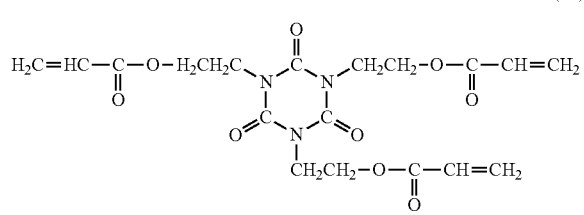

(IV)

Organic Peroxide (D)
- (D1) Perhexyne (trade name) 25B (trade name, available from NOF Corporation, 2,5-dimethyl-2,5-di(t-butylperoxide) hexyne-3, molecular weight: 286)
- (D2) Perbutyl (trade name) P (trade name, available from NOF Corporation, α,α'-di(t-butylperoxy)diisopropylbenzene, molecular weight: 338)
- (D3) Perbutyl (trade name) D (trade name, available from NOF Corporation, di-t-butylperoxide, molecular weight: 146)

Silica
  Fused silica SFP-30MHM (trade name, available from Denka Co., Ltd., average particle size: 0.8 μm)

Organic Solvent (E)
  Toluene (available from Daishin Chemical Co., Ltd.)
  Methyl ethyl ketone (available from Sankyo Chemical Co., Ltd.)

Content of Organic Solvent in Prepreg

The content (residual amount) of the organic solvent (E) in the prepreg obtained in each of the examples and comparative examples was measured using a gas chromatograph. The results are shown in Tables 1 and 2.

Properties

The characteristics of the obtained copper-clad laminate sheets were evaluated as follows. The results are shown in Tables 1 and 2.

Dielectric Constant, Dielectric Loss Tangent

The copper foil of the obtained copper-clad laminate sheet was peeled off, and the dielectric constant and dielectric loss tangent at 10 GHz were measured by the disk-type cavity resonator method in accordance with JIS C2138:2007 using a PNA network analyzer (available from Keysight Technologies Inc., model number: N5227A). Note that a dielectric constant of not greater than 3.6 was considered to be passing, and a dielectric loss tangent of not greater than 0.009 was considered to be passing.

Glass Transition Temperature

The copper foil of the obtained copper-clad laminate sheet was peeled off, and the glass transition temperature (peak temperature of tanδ) at 10 Hz was measured by the dynamic mechanical analysis method (DMA method).

Peel Strength

The peel strength was measured by subjecting the copper foil of the copper-clad laminate sheet to a 90 degree peel test (units: kN/m). The 90 degree peel test was implemented using a sample for which one end of a cured copper-clad laminate sheet was peeled approximately 10 mm. The sample was attached to a metal support fixture, the leading end of the peeled copper foil was gripped, and then 25 mm or more of the copper foil was peeled off at a speed of 50 mm/min in a direction perpendicular to the surface of the sample.

Reflow Resistance

Through holes were formed in the obtained copper-clad laminate sheet, after which a circuit (wiring layer) and a through-hole conductor were formed to obtain an inner layer sheet. The inner layer sheet and the prepreg were superimposed and heated and pressurized at 190° C. and 4 MPa to obtain a wiring board having a thickness of 3.0 mm. A Pb-free reflow test was implemented in which a step of passing the obtained wiring board through a Pb-free reflow furnace for 15 seconds at a temperature of 260° C. was considered to be one cycle, a cross-section of the wiring board was confirmed using a scanning electron microscope, and the number of cycles until swelling or peeling occurred in the cross-section of the wiring board was determined. Note that in Table 1, if swelling and peeling were not confirmed in the cross-section of the wiring board after 20 cycles, the number of cycles until swelling or peeling was indicated as being 10 cycles or more.

Insulation Reliability

Through holes were formed in the obtained copper-clad laminate sheet, after which a circuit (wiring layer) and a through-hole conductor were formed to obtain an inner layer sheet. The inner layer sheet and the prepreg were superimposed and heated and pressurized at 190° C. and 4 MPa to obtain a wiring board having a thickness of 3.0 mm. The insulating property between the through-holes was tested with 10 cycles of a pretreatment: Pb-free reflow (260° C., 15 sec) under conditions of 65° C./85%/20 VDC, and the time during which the insulating resistance was maintained at $10^8 \Omega$ or higher was measured. Note that a time of 2000 hours or longer was considered to be passing.

Connection Reliability

Through holes were formed in the obtained copper-clad laminate sheet, after which a circuit (wiring layer) and a through-hole conductor were formed to obtain an inner layer sheet. The inner layer sheet and the prepreg were superimposed and heated and pressurized at 190° C. and 4 MPa to obtain a wiring board having a thickness of 3.0 mm. After the obtained wiring board was pre-treated with the Pb-free reflow (260° C., 15 sec) for 10 cycles, a test was implemented in which a treatment at conditions of −65° C. for 30 minutes and 125° C. for 30 minutes was considered to be one cycle, after which the cross-section of the wiring board was confirmed using a scanning electron microscope, and the number of cycles until cracking occurred in the through-holes of the wiring board was determined. Note that the cross-section of the wiring board was confirmed with the scanning electron microscope every 100 cycles for 1000 cycles, and then every 500 cycles after the 1000 cycles. In addition, in Table 1, cases in which cracking in the through holes of the wiring board was not confirmed after 3500 cycles were designated as 3000 cycles or more. Note that a number of cycles until cracking of 2000 cycles or more was considered to be passing.

|  |  | Unit | Examples | | | | | |
|---|---|---|---|---|---|---|---|---|
|  |  |  | 1 | 2 | 3 | 4 | 5 | 6 |
| (A) Modified polyphenylene ether | (A1) SA9000 | mass % | 65 | 65 | 65 | 65 | — | 65 |
|  | (A2) OPE-2St | mass % | — | — | — | — | 65 | — |
| Modified polyphenylene ether other than component (A) | (a1) APPE-LM | mass % | — | — | — | — | — | — |
| (B) Crosslinking agent | (B1) TAICROS | mass % | 20 | 20 | 20 | 25 | 20 | 20 |
|  | (B2) TAC | mass % | — | — | — | — | — | — |
|  | (B3) A-DCP | mass % | — | — | — | — | — | — |
| (C) Crosslinking aid | (C1) TAC HT-P | mass % | 10 | 10 | 10 | 5 | 10 | — |
|  | (C2) OGSOL AL-001 | mass % | — | — | — | — | — | 10 |
| Crosslinking aid other than component (C) | (c1) FA-731A | mass % | — | — | — | — | — | — |
| (D) Organic peroxide | (D1) Perhexyne (trade name) 25B | mass % | 5 | — | — | — | — | 5 |
|  | (D2) Perbutyl (trade name) P | mass % | — | 5 | — | — | — | — |
|  | (D3) Perbutyl (trade name) D | mass % | — | — | 5 | 5 | 5 | — |
| Silica | SFP-30MHM | mass % | 30 | 30 | 30 | 30 | 30 | 30 |
| (E) Organic solvent | Toluene | mass % | — | — | — | — | 50 | — |
|  | Methyl ethyl ketone | mass % | 50 | 50 | 50 | 50 | — | 50 |
| Content of organic solvent in prepreg |  | mass % | 0.1 | 0.1 | 0.1 | 0.1 | 0.3 | 0.1 |
| Dielectric constant [10 GHz] |  | — | 3.6 | 3.6 | 3.6 | 3.6 | 3.6 | 3.6 |
| Dielectric loss tangent [10 GHz] |  | — | 0.0041 | 0.0038 | 0.0029 | 0.0028 | 0.0030 | 0.0038 |
| Glass transition temperature |  | °C. | 240 | 230 | 230 | 220 | 220 | 230 |
| Peel strength |  | kN/m | 0.7 | 0.7 | 0.7 | 0.6 | 0.6 | 0.5 |
| Reflow resistance |  | cycles | 10 or more | 10 or more | 10 or more | 10 or more | 10 or more | 10 or more |
| Insulation reliability |  | h | 3000 or longer | 3000 or longer | 3000 or longer | 3000 or longer | from 2000 to less than 3000 | 3000 or longer |
| Connection reliability |  | cycles | 3000 or more | 3000 or more | 3000 or more | 3000 or more | from 2000 to less than 3000 | 3000 or more |

|  |  |  | Examples | | | | | |
|---|---|---|---|---|---|---|---|---|
|  |  |  | 7 | 8 | 9 | 10 | 11 | 12 |
| (A) Modified polyphenylene ether | (A1) SA9000 | mass % | 65 | 65 | 65 | — | 65 | 65 |
|  | (A2) OPE-2St | mass % | — | — | — | 65 | — | — |
| Modified polyphenylene ether other than component (A) | (a1) APPE-LM | mass % | — | — | — | — | — | — |
| (B) Crosslinking agent | (B1) TAICROS | mass % | 20 | 20 | 25 | 20 | — | — |
|  | (B2) TAC | mass % | — | — | — | — | 20 | — |
|  | (B3) A-DCP | mass % | — | — | — | — | — | 20 |
| (C) Crosslinking aid | (C1) TAC HT-P | mass % | — | — | — | — | 10 | 10 |
|  | (C2) OGSOL AL-001 | mass % | 10 | 10 | 5 | 10 | — | — |
| Crosslinking aid other than component (C) | (c1) FA-731A | mass % | — | — | — | — | — | — |

-continued

|  |  | Unit |  |  |  |  |  |  |
|---|---|---|---|---|---|---|---|---|
| (D) Organic peroxide | (D1) Perhexyne (trade name) 25B | mass % | — | — | — | — | 5 | 5 |
|  | (D2) Perbutyl (trade name) P | mass % | 5 | — | — | — | — | — |
|  | (D3) Perbutyl (trade name) D | mass % | — | 5 | 5 | 5 | — | — |
| Silica | SFP-30MHM | mass % | 30 | 30 | 30 | 30 | 30 | 30 |
| (E) Organic solvent | Toluene | mass % | — | — | — | 50 | — | — |
|  | Methyl ethyl ketone | mass % | 50 | 50 | 50 | — | 50 | 50 |
| Content of organic solvent in prepreg |  | mass % | 0.1 | 0.1 | 0.1 | 0.3 | 0.1 | 0.1 |
| Dielectric constant [10 GHz] |  | — | 3.6 | 3.6 | 3.6 | 3.6 | 3.6 | 3.6 |
| Dielectric loss tangent [10 GHz] |  | — | 0.0032 | 0.0025 | 0.0026 | 0.0026 | 0.0039 | 0.0037 |
| Glass transition temperature |  | °C. | 220 | 220 | 220 | 220 | 225 | 220 |
| Peel strength |  | kN/m | 0.5 | 0.5 | 0.5 | 0.5 | 0.7 | 0.6 |
| Reflow resistance |  | cycles | 10 or more | 10 or more | 10 or more | 10 or more | 10 or more | 10 or more |
| Insulation reliability |  | h | 3000 or longer | 3000 or longer | 3000 or longer | from 2000 to 3000 | 3000 or longer | 3000 or longer |
| Connection reliability |  | cycles | 3000 or more | 3000 or more | 3000 or more | from 2000 to less than 3000 | 3000 or more | 3000 or more |

TABLE 2

|  |  | Unit | Comparative Examples |  |  |  |  |  |
|---|---|---|---|---|---|---|---|---|
|  |  |  | 1 | 2 | 3 | 4 | 5 | 6 |
| (A) Modified polyphenylene ether | (A1) SA9000 | mass % | 65 | 65 | — | 65 | 65 | 65 |
|  | (A2) OPE-2St | mass % | — | — | — | — | — | — |
| Modified polyphenylene ether other than component (A) | (a1) APPE-LM | mass % | — | — | 65 | — | — | — |
| (B) Crosslinking agent | (B1) TAICROS | mass % | 30 | — | 20 | — | — | 20 |
|  | (B2) TAC | mass % | — | 30 | — | — | — | — |
|  | (B3) A-DCP | mass % | — | — | — | — | — | — |
| (C) Crosslinking aid | (C1) TAC HT-P | mass % | — | — | 10 | 30 | — | — |
|  | (C2) OGSOL AL-001 | mass % | — | — | — | — | 30 | — |
| Crosslinking aid other than component (C) | (c1) FA-731A | mass % | — | — | — | — | — | 10 |
| (D) Organic peroxide | (D1) Perhexine (trade name) 25B | mass % | — | — | — | — | — | 5 |
|  | (D2) Perbutyl (trade name) P | mass % | — | — | — | — | — | — |
|  | (D3) Perbutyl (trade name) D | mass % | 5 | 5 | 5 | 5 | 5 | — |
| Silica | SFP-30MHM | mass % | 30 | 30 | 10 | 30 | 30 | 30 |
| (E) Organic solvent | Toluene | mass % | — | — | — | — | — | 50 |
|  | Methyl ethyl ketone | mass % | 50 | 50 | 50 | 50 | 50 | — |
| Content of organic solvent in prepreg |  | mass % | 0.1 | 0.1 | 0.4 | 0.1 | 0.1 | 0.3 |
| Dielectric constant [10 GHz] |  | — | 3.6 | 3.6 | 3.6 | 3.6 | 3.6 | 3.8 |
| Dielectric loss tangent [10 GHz] |  | — | 0.0028 | 0.0045 | 0.0095 | 0.0085 | 0.0075 | 0.0125 |
| Glass transition temperature |  | °C. | 220 | 180 | 200 | 150 | 170 | 150 |
| Peel strength |  | kN/m | 0.5 | 0.5 | 0.6 | 0.2 | 0.4 | 0.3 |

TABLE 2-continued

| | Unit | Comparative Examples | | | | | |
| --- | --- | --- | --- | --- | --- | --- | --- |
| | | 1 | 2 | 3 | 4 | 5 | 6 |
| Reflow resistance | cycles | 10 | 5 | 5 | 0 | 3 | 3 |
| Insulation reliability | h | 1500 | 1000 | 500 | 100 | 300 | 100 |
| Connection reliability | cycles | 1500 | 1000 | 300 | 100 | 300 | 300 |

As indicated in Table 1, it is clear that the copper-clad laminate sheets obtained using a resin composition containing the components (A) to (D) as presented in the examples suppress the dielectric loss tangent, and the wiring boards obtained using these copper-clad laminate sheets excel in reflow resistance, insulation reliability, and connection reliability.

REFERENCE SIGNS LIST

1 Base member
2 Semi-cured product of resin composition
10 Prepreg
20 Metal-clad laminate sheet
11 Insulation layer
12 Conductive metal foil
30 Wiring board
21 Insulation layer
22 Conductor layer (circuit)
23 Through-hole

The invention claimed is:

1. A resin composition comprising:
(A) a modified polyphenylene ether comprising a main chain modified at a terminal end with a functional group comprising a carbon-carbon double bond;
(B) a crosslinking agent;
(C) a crosslinking aid; and
(D) an organic peroxide;
the crosslinking aid (C) being a compound represented by General Formula (I) or General Formula (II):

[Chem. 1]

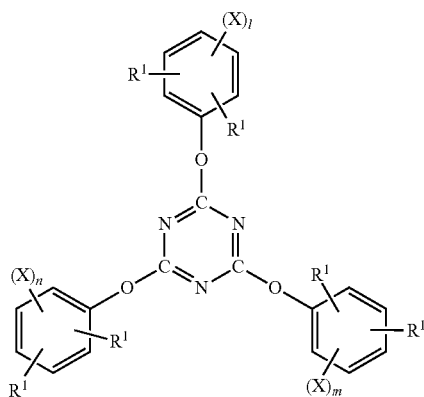

(I)

wherein, each X is independently a 2-propenyl group or a 2-methyl-2-propenyl group, and each $R^1$ is independently a hydroxy group or a lower alkoxy group, in a case where a plurality of X and a plurality of $R^1$ are present, the plurality of X may be the same or different and the plurality of $R^1$ may be the same or different, and l, m and n are integers of 0 or 1, and at least one of these is 1;

[Chem. 2]

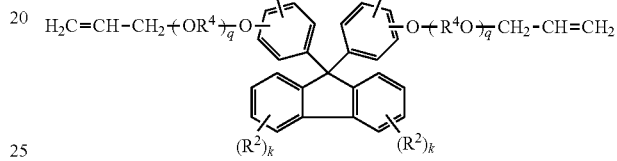

(II)

wherein, $R^2$ and $R^3$ are each independently a hydrogen atom or a hydrocarbon group, and each $R^4$ is independently an alkylene group, in a case where a plurality of $R^2$ to $R^4$ are present, the plurality of $R^2$ may be the same or different, $R^3$ may be the same or different, and $R^4$ may be the same or different, and k is an integer from 0 to 4, p is an integer from 0 to 4, and q is an integer from 0 to 10.

2. The resin composition according to claim 1, wherein the modified polyphenylene ether (A) is a compound represented by General Formula (III):

[Chem. 3]

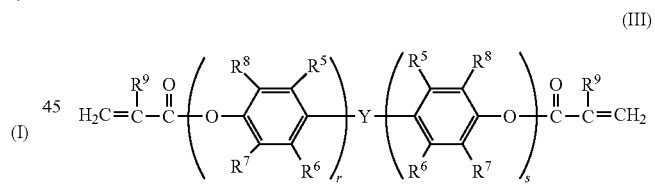

(III)

wherein, $R^5$ to $R^8$ are each independently a hydrogen atom, a linear or branched alkyl group having from 1 to 8 carbons, a linear or branched alkenyl group having from 2 to 8 carbons, a linear or branched alkynyl group having from 2 to 8 carbons, or an aryl group having from 6 to 10 carbons, each $R^9$ is independently a hydrogen atom or a linear or branched alkyl group having from 1 to 8 carbons, and Y is an oxygen atom, a methylene group, or a dimethyl methylene group, the plurality of $R^5$ may be the same or different, $R^6$ may be the same or different, $R^7$ may be the same or different, $R^8$ may be the same or different, and $R^9$ may be the same or different, and r is an integer from 1 to 100, s is an integer from 1 to 100, and r+s is an integer from 2 to 200.

3. The resin composition according to claim 1, wherein the crosslinking agent (B) is at least one compound selected from the group consisting of dibutylbenzene, tricyclodecane dimethanol diacrylate, tricyclodecane dimethanol dimethacrylate, triallyl cyanurate and triallyl isocyanurate.

4. The resin composition according to claim 1, further comprising:
(E) toluene and/or methyl ethyl ketone as an organic solvent, wherein
the content of the organic solvent (E) when externally added is from 25 mass % to 100 mass % when the total amount of the modified polyphenylene ether (A), the crosslinking agent (B), the crosslinking aid (C), and the organic peroxide (D) is 100 mass %.

5. A prepreg comprising:
a base member; and
a semi-cured product of the resin composition described in claim 1, obtained by coating or impregnating the base member with the resin composition.

6. The prepreg according to claim 5, wherein
the amount of the organic solvent (E) contained in the prepreg is 0.5 mass % or less.

7. A metal-clad laminate sheet comprising:
a cured product of the prepreg described in claim 5; and
a conductive metal foil provided on a surface of the cured product of the prepreg.

8. A wiring board comprising:
a plurality of insulation layers and an electrical conductor layer disposed between the insulation layers,
the insulation layers being formed by fully curing the prepreg according to claim 5.

9. The resin composition according to claim 2, wherein
the crosslinking agent (B) is at least one compound selected from the group consisting of dibutylbenzene, tricyclodecane dimethanol diacrylate, tricyclodecane dimethanol dimethacrylate, triallyl cyanurate and triallyl isocyanurate.

10. The resin composition according to claim 2, further comprising:
(E) toluene and/or methyl ethyl ketone as an organic solvent, wherein
the content of the organic solvent (E) when externally added is from 25 mass % to 100 mass % when the total amount of the modified polyphenylene ether (A), the crosslinking agent (B), the crosslinking aid (C), and the organic peroxide (D) is 100 mass %.

11. The resin composition according to claim 3, further comprising:
(E) toluene and/or methyl ethyl ketone as an organic solvent, wherein
the content of the organic solvent (E) when externally added is from 25 mass % to 100 mass % when the total amount of the modified polyphenylene ether (A), the crosslinking agent (B), the crosslinking aid (C), and the organic peroxide (D) is 100 mass %.

12. A prepreg comprising:
a base member; and
a semi-cured product of the resin composition described in claim 2, obtained by coating or impregnating the base member with the resin composition.

13. A prepreg comprising:
a base member; and
a semi-cured product of the resin composition described in claim 3, obtained by coating or impregnating the base member with the resin composition.

14. A prepreg comprising:
a base member; and
a semi-cured product of the resin composition described in claim 4, obtained by coating or impregnating the base member with the resin composition.

15. A metal-clad laminate sheet comprising:
a cured product of the prepreg described in claim 6; and
a conductive metal foil provided on a surface of the cured product of the prepreg.

16. A wiring board comprising:
a plurality of insulation layers and an electrical conductor layer disposed between the insulation layers,
the insulation layers being formed by fully curing the prepreg according to claim 6.

* * * * *